(12) United States Patent
Adams

(10) Patent No.: US 8,355,429 B2
(45) Date of Patent: Jan. 15, 2013

(54) JITTER REDUCTION DEVICE AND METHOD

(75) Inventor: Neil Adams, Thoiry (FR)

(73) Assignee: Agilent Technologies, Inc, Santa Clara, CA (US)

( * ) Notice: Subject to any disclaimer, the term of this patent is extended or adjusted under 35 U.S.C. 154(b) by 292 days.

(21) Appl. No.: 12/648,066

(22) Filed: Dec. 28, 2009

(65) Prior Publication Data

US 2010/0195778 A1 Aug. 5, 2010

(51) Int. Cl.
*H04B 3/46* (2006.01)
*H04B 17/00* (2006.01)
*H04Q 1/20* (2006.01)

(52) U.S. Cl. ......... 375/226; 375/285; 375/371; 370/516

(58) Field of Classification Search .............. 375/226, 375/285, 371; 370/516; 702/69
See application file for complete search history.

(56) References Cited

U.S. PATENT DOCUMENTS

| | | | |
|---|---|---|---|
| 6,424,282 B1 | 7/2002 | Maenza | |
| 6,744,835 B1 * | 6/2004 | Panicker et al. | 375/355 |
| 7,120,102 B2 * | 10/2006 | Kimura et al. | 369/53.34 |
| 7,133,483 B1 * | 11/2006 | Kramer et al. | 375/371 |
| 7,206,368 B2 * | 4/2007 | Engel et al. | 375/371 |
| 2006/0291548 A1 * | 12/2006 | Mattes et al. | 375/226 |
| 2008/0238752 A1 * | 10/2008 | Shimizu et al. | 341/155 |
| 2008/0247451 A1 * | 10/2008 | Yamaguchi | 375/226 |
| 2009/0234604 A1 * | 9/2009 | Hou et al. | 702/69 |

OTHER PUBLICATIONS

"Patents Act 1977: Search Report under Section 17(5)" for United Kingdom (GB) Application No. GB0901562.9, May 13, 2009.
"Patents Act 1977: Search Report under Section 17(5)" for United Kingdom (GB) Application No. GB0901562.9, May 12, 2009.

* cited by examiner

*Primary Examiner* — Jean B Corrielus

(57) ABSTRACT

In accordance with a representative embodiment, a method for reducing the effect of jitter in a sampled signal is described. The method comprises: obtaining a frequency-domain data set representing the sampled signal; obtaining an average sideband amplitude distribution generated by jitter around one or more principal frequencies of the signal; estimating the jitter phases for sidebands generated by jitter in the frequency-domain data set; subtracting a jitter contribution characterized by the average sideband amplitude distribution and the estimated jitter phases from the data record.

13 Claims, 9 Drawing Sheets

JITTER REDUCTION DEVICE AND METHOD

United Kingdom (GB) Patent Application number 0901562.9 is hereby incorporated by reference in its entirety into the present United States patent specification.

FIELD OF THE INVENTION

The present invention concerns a method of reducing the effect of timing jitter in a signal digitizer, as well as a signal digitizer or a digital signal processor implementing such method. Further embodiments of the present invention are related to a software code containing instruction to reduce the effect of timing jitter in a digitized signal.

BACKGROUND OF THE INVENTION

Jitter is an unwanted deviation from an exact periodic repetition of some function or signal in an electronic device. In signal digitizers, in particular, jitter is a source of error that introduces an uncertainty in the aperture time of the ADC and causes the samples to be unevenly spaced in the time domain. Jitter can be intrinsically contained in the timing clock, or it can derive from randomness in the ADC's response, or it can be due to a combination of these two factors.

Several techniques are known to provide precise clock signals and repeatable aperture control in digitizer. These techniques, however do not allow a complete elimination of the jitter. In the quest for increasingly faster digitizers, jitter is often a limiting factor and, therefore, there is a need for a technique for alleviating the effect of jitter in digitized data.

It is therefore an aim of the present invention to provide a method for reducing the effect of jitter in digital sampled data. Furthermore, it is an aim of the present invention to provide a signal digitizer system in which the error due to jitter is less than in the system known in the art.

SUMMARY OF THE INVENTION

According to the invention, these aims are achieved by means of the method and the device that are the object of the independent claims in the corresponding categories.

BRIEF DESCRIPTION OF THE DRAWINGS

The invention will be better understood with the aid of the description of an embodiment given by way of example and illustrated by the figures, in which.

DETAILED DESCRIPTION

An embodiment of the jitter reduction method of the invention will now be described in relation to a digitizer connected to an ideal single-frequency input signal described by a single sinusoidal component: $A \cdot \exp[j(\omega_1 t + \theta_1)]$ having angular frequency $\omega_1 = 2 \cdot \pi F_1$ and phase $\theta_1$. The effect of the jitter is to introduce a time modulation by an unknown jitter function $J\{t\}$. The resulting sampled signal is then described by $$A \exp[j(\omega_1(t+J\{t\})+\theta_1)] \quad (1)$$

Figure 1:
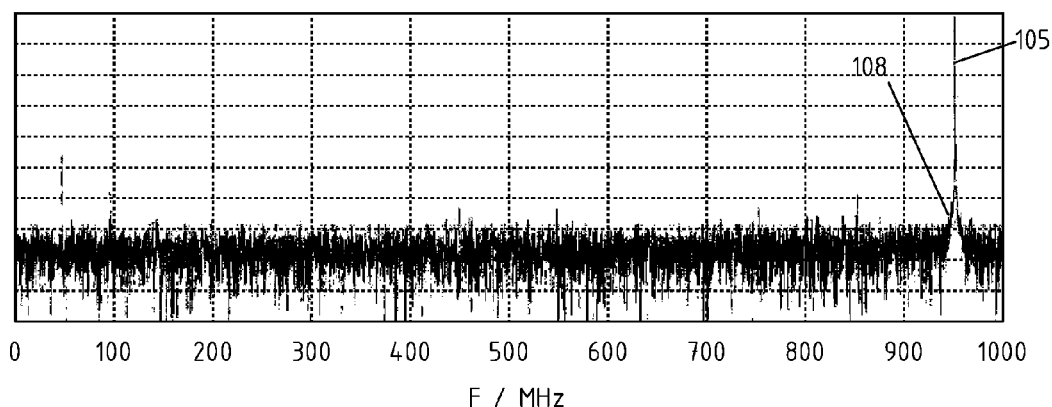
FIG. 1 illustrates a typical spectrum generated by a Fourier transform of a digitized signal and the effect of jitter. The figure is a diagram of the absolute value of a complex Fourier transform.

FIG. 1 illustrates a typical spectrum generated by a Fourier transform of the digitized signals in this case. The effect of the jitter is visible in the two-sided sideband 108 centred on the main peak 105.

Equation (1) can be rewritten as:

$$A \exp[j(\omega_1 t + \theta_1)] \cdot \exp[j\omega_1 J\{t\}] \quad (2)$$

replacing $\exp[j\omega_1 J\{t\}]$ with the corresponding Taylor expansion this gives:

$$A \exp[j(\omega_1 t + \theta_1)] \cdot [1 + j\omega_1 J\{t\} + \ldots] \quad (3)$$

It is safe to neglect higher-order terms insofar as $|\omega J\{t\}| \ll 1$. This condition is known as the "narrow band frequency modulation" limit and is safely met in typical high-speed digitizers.

Equation (3) shows that, to a first order approximation, the effect of the jitter is to phase-modulate the signal with a replica of the jitter function, weighted by the frequency $\omega_1$ and phase-shifted by 90° (multiplied by the imaginary unit j).

In practice the jitter function $J\{t\}$ will be a real-valued and can be represented by a Fourier expansion:

$$J\{t\} = \sum A_n \sin(w_n t + \theta_n) \quad (4)$$

If this jitter function is modulated into the signal phase it will cause sidebands around the signal main components at $\pm w_n$. The jitter function, in any real situation, has a continuous frequency spectrum, thus, in the Fourier representation (4), windowing effects will distribute the corresponding continuous spectral energy distribution over multiple frequency bins causing sidebands close to the signal components of interest. The choice of the Fourier representation, however, effectively "quantizes" the continuous jitter into discrete frequency bins that can be treated individually.

In order to simplify the treatment, we will make the assumption that, if we take a Fourier transform of our data, our record length and signal frequencies are such that all our individual signal frequencies fall exactly into one set of single-frequency bins:

$$\omega_n = 2\pi n F_{bin} \quad (5)$$

-continued where $$F_{bin} = \frac{1}{\text{Record length}}$$

In this manner the continuous time jitter effects are represented by discrete sidebands having a frequency that is a multiple of $F_{bin}$:

$$J\{t\} = \sum A_n \sin(2\pi n F_{bin} r + \theta_n) \quad (6)$$

Figure 3:
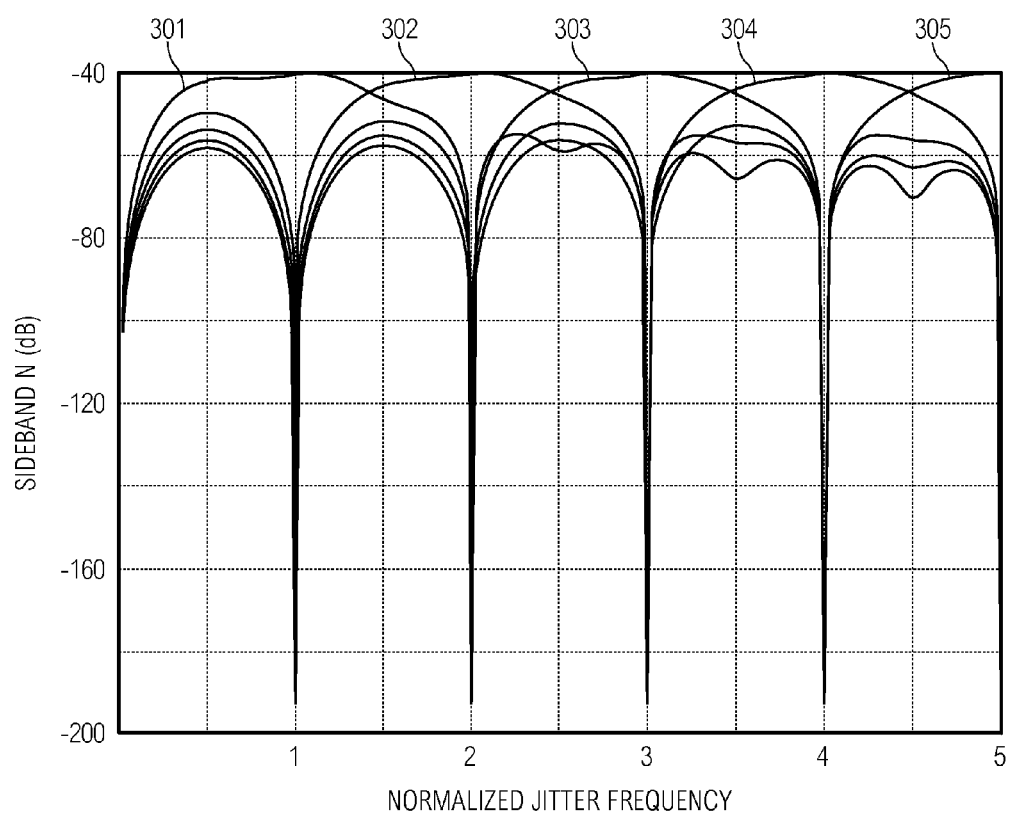
FIG. 3 illustrates diagrammatically the manner in which jitter-induced phase modulation spreads over multiple sidebands.

FIG. 3 shows the manner in which phase modulation from a simple jitter frequency spreads over multiple sidebands in the general case. The x-axis represents the jitter frequency $F_{jitt}$ frequency normalized to the frequency $F_{bin}$ defined above, which also corresponds to sideband spacing. The y-axis is the spectral energy relative t to the main signal component scaled by the factor $\omega_1$ mentioned above. The graph lines 301-305 show the energy in sidebands 1 to 5. A vertical line at $F_{jitt}/F_{bin}=0.5$, for example intercepts the graph lines at values that can be used to reconstruct a frequency plot as shown in FIG. 1. The graphs show sharp nulls at integral values of $F_{jitt}/F_{bin}$, due to the fact that we have truncated the series expansion in formula (3).

Supposing now that another signal component, with frequency $\omega_2 \neq \omega_1$ is present in the same jittered data record, together with the first component having frequency $\omega_1$, we can write, for this component:

$$A \cdot \exp[j(\omega_2 t + \omega_2)][1 + j\omega_2 J\{t\} + \ldots] \quad (7)$$

where the Taylor expansion of $\exp[j\omega_2 J\{t\}]$ has been truncated after the first-order term in $\omega_2$, as in equation (3). It can be seen that the $1^{st}$ order phase modulation term is scaled now by $\omega_2$ instead of $\omega_1$, but the jitter phase modulation function, and therefore the sideband structure have exactly the same form for both peaks. The second and higher-order terms, which we have discarded, have also the same structure, but are weighted with non-linear $\omega_2^n$ terms. In the following, we will consider that these terms are small enough to be safely ignored but this is not a limitation of the invention. In fact they could be resolved by iteratively applying the post-processing method presented in this embodiment of the invention. This makes the post-processing technique of the invention suitable for data with very high phase modulation levels.

In view of the mathematical treatment presented above, the present invention relates to a post-processing method that estimates the amplitudes and phases of jitter sidebands around a component of a sampled signal having a determined frequency, and subtracts a jitter component characterized by the average jitter sideband amplitude and the estimated jitter phases from the data record. Preferably the invention exploits the correlations in the sidebands around frequency components of the signal for reducing the effect of jitter in a sampled signal.

To be more specific, we consider the case of a signal having N narrow-band spectral components, or input frequencies, corresponding to as many peaks in the frequency spectrum, each of which is surrounded by a skirt that has $-M$ to $+M$ sideband bins. We indicate with pnsb($F_n,S_m$) the sideband m of the input frequency n. The pnsb($F_n$,O) is actually the spectral component itself.

We use the notation $R_{amp}(F_n,S_m)$ to designate the relative amplitude of the m'th sideband with respect to the fundamental signal at frequency $F_n$, and $R_{phase}(F_n, S_m)$ for the phase difference (in radians) between the n'th signal frequency and its m'th sideband. The mathematical treatment above shows that:

$$\frac{R_{amp}(F_1, S_1)}{\omega_1} = \frac{R_{amp}(F_2, S_1)}{\omega_2} = \frac{R_{amp}(F_3, S_1)}{\omega_3} = \ldots \quad (8)$$

$$R_{phase}(F_1, S_1) = R_{phase}(F_2, S_1) = R_{phase}(F_3, S_1) = \ldots \quad (9)$$

that is, sideband amplitudes of the same order are simply scaled by the fundamental signal frequency $\omega_n$, and that the relative phases of correlated sidebands of the same order around different spectral components are the same. Moreover, the following symmetry relations are true $$R_{amp}(F_n, S_m) = R_{amp}(F_n, S_{-m}) \quad (10)$$

$$R_{phase}(F_n, S_m) + R_{phase}(F_n, S_{-m}) = \pi. \quad (11)$$

For a system with a repeatable phase noise spectral density, the average absolute amplitude of any particular sideband around any spectral component can be predicted and/or measured with sufficient accuracy. This can be done, for example, by averaging the sidebands of known signal components over a sufficient number of measurements. Even if the jitter is completely random in the time domain, the different phase modulation jitter components in any particular data record will combine to give sidebands with a predictable average amplitude and a certain, unknown phase for each sideband around a signal component that is correlated with other sidebands around other components or the same component.

The invention then proposes a method to use the correlation existing between jitter sidebands, for example the correlations shown by equations 8)-11), estimate the unknown phase of each sideband and, therefore subtract it from the data set to obtain a refined data set with less jitter.

Because the correlation between sideband sets of each signal frequency exist between sidebands of the same order (see equations 10 and 11), preferably, the method of the invention treats each sideband order ±m as a separate correlated group. In the following, a complex frequency representation, extended from zero to the Nyquist frequency is used, although the invention can be applied to other representations as well.

An embodiment of the present invention relates to the construction of a correlation mask for each order of sideband considered. Considering, by way of example, the first order sideband, we have seen that, in our quantized frequency representation, the jitter at $F_{bin}$ multiplies each signal component frequency $\omega_n$ by $\omega_n A_1 \sin(2\pi F_{bin} t + \theta)$ in which $A_1$ is our average first-order sideband amplitude value, and $\theta$ is an unknown phase that we are trying to find. The mask is then generated, for example, by the following steps:

Taking the Fourier representation of the data record;

Multiplying each frequency bin of the frequency-domain data by its scalar frequency value; this will introduce a $|\omega|$ weight in the mask, as in equation (3);

Shifting the spectrum one bin to the left, and multiplying by $A_1 e^{j\theta}$. The phase of the signal component has been preserved and impressed into the sideband, with an additional phase shift of $\theta$.

Shifting the spectrum one bit to the right and multiplying by $A_1 e^{j(\pi-\theta)}$.

Adding the result of steps 3) and 4) together to create the correlation mask.

In this procedure not only the "desired" signal components in the data records will generate sidebands in the mask, but also the jitter sidebands will generate their own sidebands. In most practical cases, however, in which the factor $|A_1|$ is of the order of 1/100 or less, this spurious contribution can be safely neglected. In alternative, the mask could be built on a selection of frequency bins in the sample that are considered as representative of the desired signal.

The jitter reduction process proceeds by finding the phase θ of the mask that minimizes the energy in the data record when subtracted from the original data record. This can be obtained in several ways, for example by known minimization, or correlation, or successive approximation techniques.

Once a satisfactory value is found for the phase of the first pair of sidebands The process continues moving to the successive pair of sidebands, in this case m=±2, and so on until a sufficient number of sidebands is processed. It was found that processing a limited number of sidebands, or example of the order of ten or one hundred sidebands, provides satisfactory results in terms of jitter reduction.

In a general case it could happen that jitter sidebands of two signal components that are close in frequency overlap. This means that a particular bin is both a right sideband of order m of signal component $F_n$ and a left sideband of order –p of adjacent signal component $F_{+1}$. Two unknown phases must then be determined for the sideband, the phase $θ_m$ and the phase $θ_{-p}$. This situation can be treated with multi-dimensional minimization techniques, or other equivalent algorithms.

In a simplified embodiment of the invention, the jitter sidebands are removed from the data sample by using the knowledge of the sideband amplitude pnsb( ) alone, without estimation of the jitter phase.

Let us assume that a signal spectral component of interest overlaps with the jitter sidebands of a nearby stronger signal. A jitter suppression algorithm is most useful when the input signal and the jitter component are very close in amplitude. We will assume in the following that the input signal has the same amplitude as the jitter component, and we will take the amplitude as being one, but this embodiment is not limited to this case and is effective in general, as it will be explained further on.

If $\bar{S}$ and $\bar{J}$ denote the complex signal and jitter vectors, the measured vector $\bar{M}$ is given by $\bar{S}+\bar{J}$ with all the phases being equally possible.

The simplified correction techniques consists in subtracting from $\bar{M}$ a vector that has the same expected amplitude as the vector $\bar{J}$. As the phase of $\bar{J}$ is unknown, the phase of $\bar{M}$ is used as being the most likely, that is the jitter phase is estimated as equal to the phase of the sampled signal. It can be shown that this is the phase of the correction that minimized the energy in the corrected vector $\bar{C}$. This is expressed as:

$$\bar{C} = \bar{M} - |\bar{J}|^* \frac{\bar{M}}{|\bar{M}|} = \bar{M}^*(1 - |\bar{J}|/|\bar{M}|)$$

or, since by definition $|\bar{J}|=1$, $$\bar{C}=\bar{M}^*(1-1/|\bar{M}|) \quad (12)$$

Figure 4:
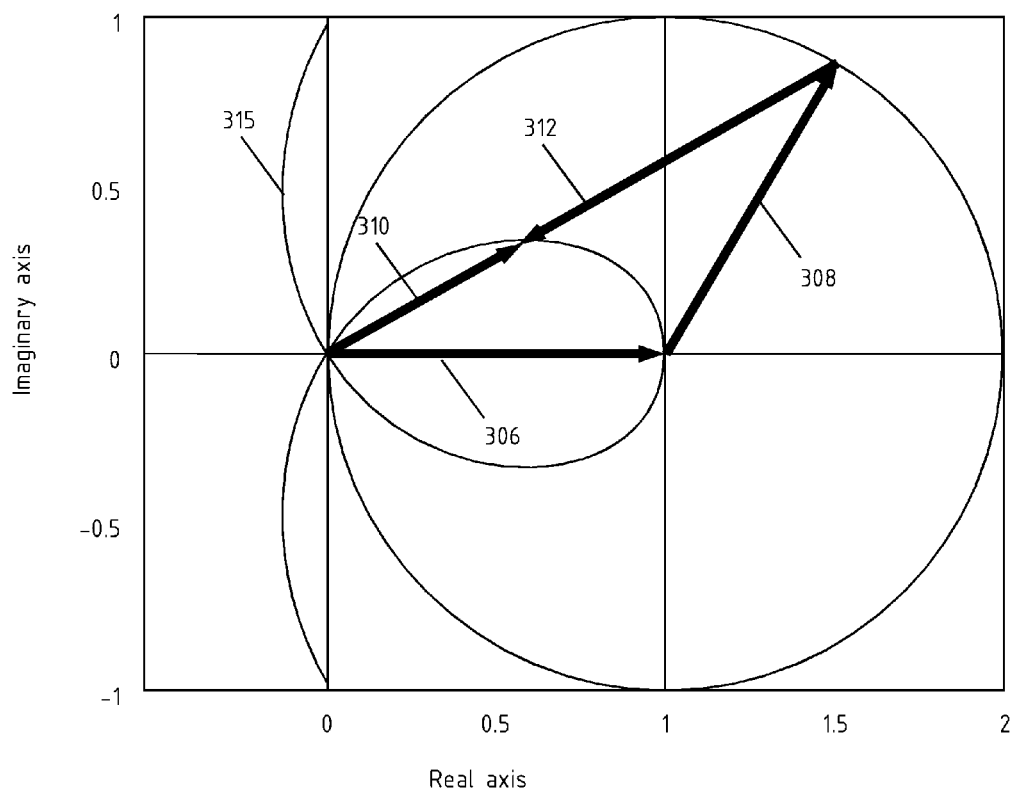
FIG. 4 illustrates an aspect of a jitter reduction method according to one aspect of the invention in the complex plane representation.

FIG. 4 shows the operation of equation (12) in the complex plane representation. The original signal $\bar{S}=1+0j$ is represented by vector 306 and the jitter $\bar{J}$ by vector 308, having the same unitary amplitude as the signal, and a random relative phase. The correction term $\bar{C}$ is represented by vector 312, having the same direction as the resulting $\bar{M}=\bar{S}+\bar{J}$, and unitary length. $\bar{C}$, the corrected result, is vector 310. It can be seen that, for all possible phases of $\bar{J}$, $\bar{C}$ lies on the curve 315.

This simplified "single point" method allows a reduction of average error of both amplitude and power in the corrected signal, without knowledge of the relative phases of the vector and the jitter vector, assuming that their amplitudes are the same.

Figure 5:
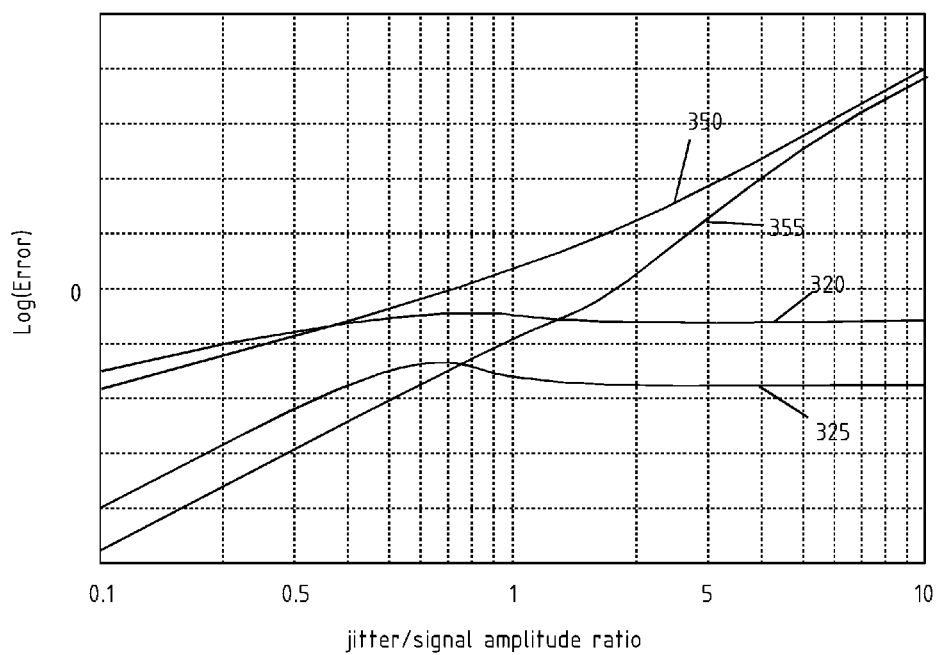
FIG. 5 reports the amplitude and power errors in uncorrected jittered data and in the corresponding data processed with a jitter-reduction method according to one aspect of the invention.

The method can be used also when the jitter amplitude is not equal to signal amplitude, and is beneficial for large jitter amplitudes ($|\bar{S}|<|\bar{J}|$), as shown in FIG. 5 that reports the average values of amplitude and power error $E_{amp}=(|\bar{C}|-|\bar{J}|)$ (curve 355), and power error $E_{pow}=|\bar{C}|^2-|\bar{S}|^2$ (curve 350) at varying $|\bar{J}|$, with $\bar{S}=1+0j$. Curves 320 and 325 show the amplitude and power errors for the uncorrected measure data.

Figure 2:
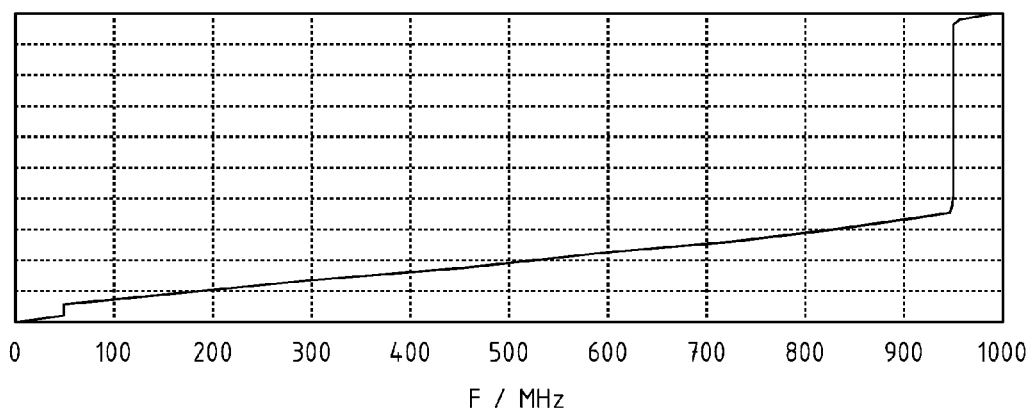
FIG. 2 shows the integrated noise power for the spectrum of FIG. 1.
Figure 6:
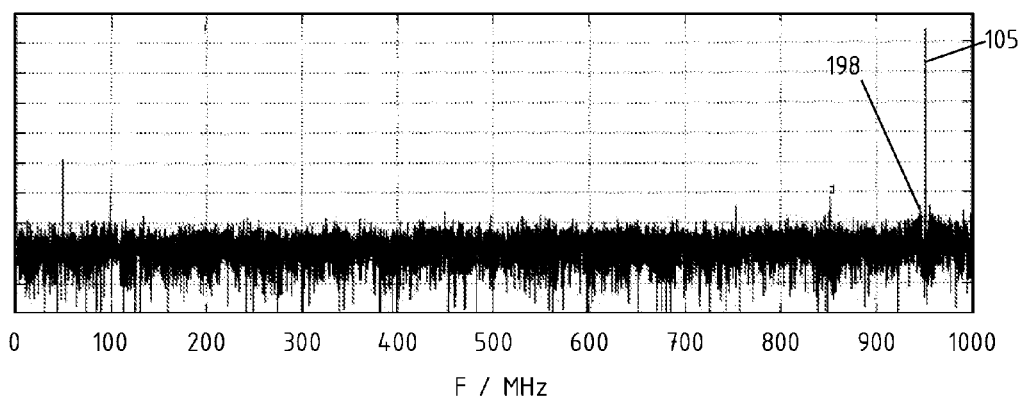
FIG. 6 shows diagrammatically the spectrum of data processed with a jitter-reduction method according to one aspect of the invention.
Figure 7:
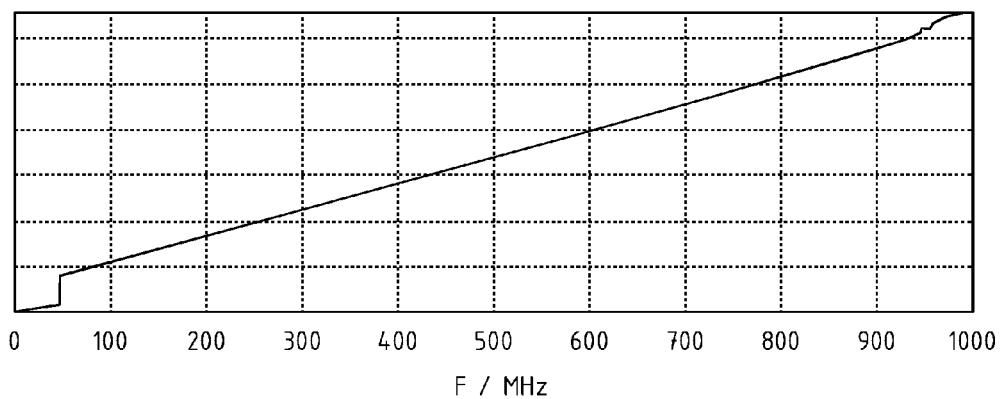
FIG. 7 shows the integrated noise power for the spectrum of FIG. 6.

FIG. 1 shows a spectrum of a signal acquired with a signal digitizer that presents a signal component 105 having a frequency of 950.60 MHz and a skirt of jitter-induced sidebands 108. FIG. 2 shows the integrated noise power for the spectrum of FIG. 1. The estimation of the expected jitter amplitude was done by collecting multiple data records and averaging the sideband amplitudes for a constant input signal with known and constant amplitude and frequency. The correlation jitter reduction technique of the invention was used and gave the corrected spectrum of FIGS. 6 and 7. The correction was done for the 10 upper and lower sidebands. As the integrated noise power shows quite clearly, the correction is successful.

The embodiments of the invention presented so far do not rely on a priori assumptions or prior knowledge on the components of the digitized signal. This is advantageous because it allows compensation of the digitizing jitter on generic signals, for example signals that include different, and possibly uncorrelated voltage and phase noises.

In some cases, however, one deals with signals including pure components that are known a priori. Possibly, a known calibration signal can be introduced purposely in the signal, for example a pure analogue tone having a proper frequency that is well separated from the frequencies of the signal of interest could be added before the digitization. The method of the invention is applicable to such cases and, advantageously, can use prior knowledge of the characteristics of a determined signal component to improve the estimation of the jitter contribution to subtract.

Figure 8:
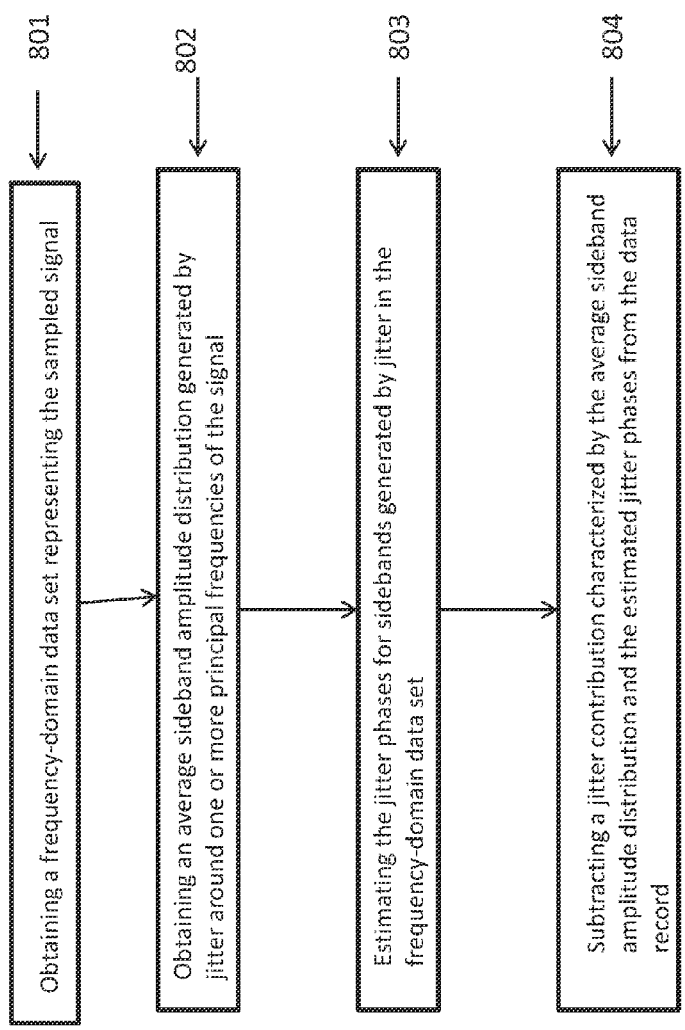
FIG. 8 illustrates a method in accordance with a representative embodiment.

In accordance with a representative embodiment depicted in FIG. 8, a method for reducing the effect of jitter in a sampled signal, comprises: obtaining a frequency-domain data set representing the sampled signal 801; obtaining an average sideband amplitude distribution generated by jitter around one or more principal frequencies of the signal 802; estimating the jitter phases for sidebands generated by jitter in the frequency-domain data set 803; subtracting a jitter contribution characterized by the average sideband amplitude distribution and the estimated jitter phases from the data record 804.

Figure 9A:
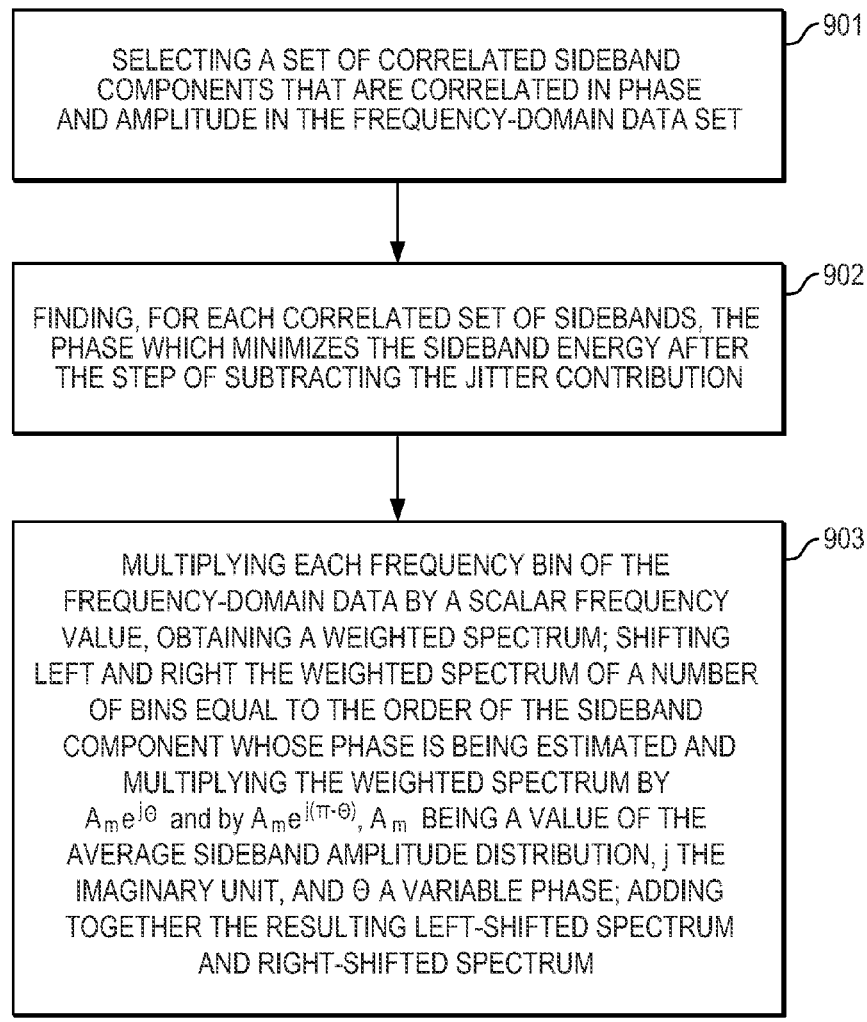
FIGS. 9A-9B illustrates additional steps of the method of FIG. 8 in accordance with representatives embodiment.
Figure 9B:
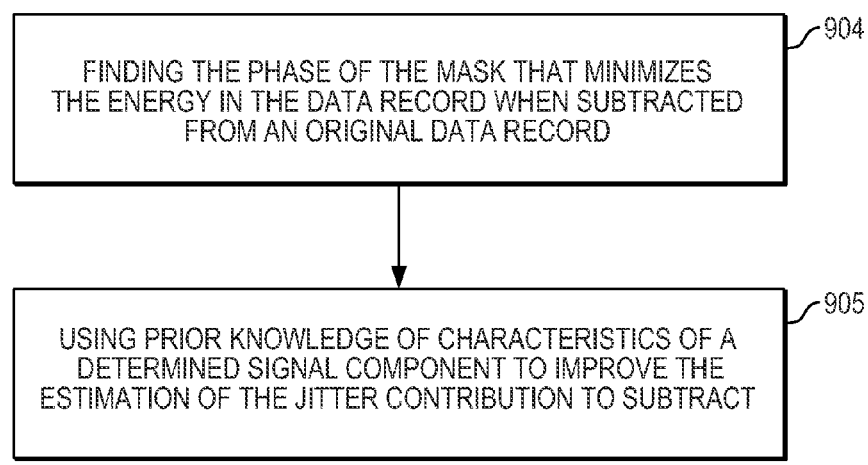

In accordance with a representative embodiment depicted in FIGS. 9A and 9B, additional features of the method are presented. Notably the additional steps in the method are not necessarily performed in sequence or in concert, and may be performed in addition to the method described in connection with FIG. 8.

At 901 the method comprises selecting a set of correlated sideband components that are correlated in phase and amplitude in the frequency-domain data set. At 902, the method comprises finding, for each correlated set of sidebands, the phase which minimizes the sideband energy after the step of subtracting the jitter contribution. At 903 the method comprises multiplying each frequency bin of the frequency-domain data by a scalar frequency value, obtaining a weighted spectrum; shifting left and right the weighted spectrum of a number of bins equal to the order of the sideband component whose phase is being estimated and multiplying the weighted spectrum by $A_m e^{j\theta}$ and by $A_m e^{j(\pi-\theta)}$, ($A_m$ being a value of the average sideband amplitude distribution, j the imaginary unit, and $\theta$ a variable phase); adding together the resulting left-shifted spectrum and right-shifted spectrum.

Turning to FIG. 9B additional steps of the method are depicted. At step 904 Finding the phase of the mask that minimizes the energy in the data record when subtracted from an original data record.

The method depicted in FIG. 8 may be instantiated in a computer program product, loadable in the memory of a digital processor, containing executable code arranged to carry out the method when executed by the digital processor.

Figure 10:
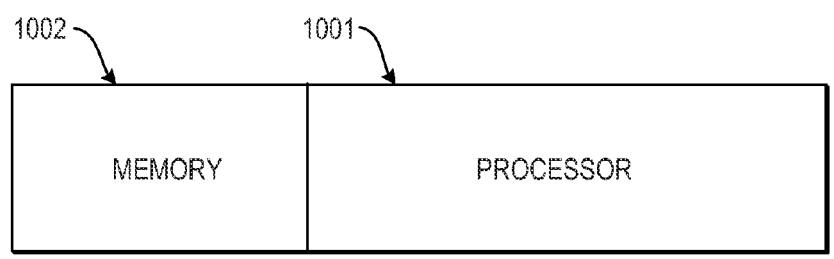
FIG. 10 is a simplified schematic diagram of a processor and a memory in accordance with a representative embodiment.

FIG. 10 is a simplified schematic diagram of a processor 1001 configured to effect the methods of representative embodiments described above. The processor comprises a memory 1002 containing executable code arranged to can out the method of representative embodiments when executed by the processor 1001.

In particular, if the digitized signal includes a known pure tone, this will manifest as a narrow line in the frequency spectrum, surrounded by jitter-induced sideband pairs. Since in this case it is known a priori that the sidebands are a product of jitter only, and contain a negligible amount of extraneous signal components, the contribution of jitter to other signal components of different frequencies can be directly estimated by applying equations (8)-(11).

The invention claimed is:

1. A method, instantiated in a non-transitory computer readable medium storing programming instructions, executable by a processor, for reducing the effect of jitter in a sampled signal, the method comprising:
   obtaining a frequency-domain data set representing the sampled signal;
   obtaining an average sideband amplitude distribution generated by jitter around one or more principal frequencies of the signal;
   estimating jitter phases for sidebands generated by jitter in the frequency-domain data set;
   subtracting a jitter contribution in the sampled signal characterized by the average sideband amplitude distribution and the estimated jitter phases from a data record.

2. The method of claim 1, further comprising a step of selecting a set of correlated sideband components that are correlated in phase and amplitude in the frequency-domain data set.

3. The method of claim 1, wherein the jitter introduces a phase modulation in the sampled signal.

4. The method of claim 2, wherein the step of estimating the jitter phases includes a step of finding, for each correlated set of sidebands, a phase which minimizes the sideband energy after the step of subtracting the jitter contribution.

5. The method of claim 2, wherein the correlated sidebands components are sideband components of the same frequency offset below and above the principal frequencies.

6. The method of claim 2, wherein the step of estimating the jitter phases comprises a step of creating a correlation mask from the frequency-domain data set.

7. The method of claim 6, wherein the correlation mask is obtained by: multiplying each frequency bin of the frequency-domain data by a its scalar frequency value, obtaining a weighted spectrum; shifting left and right the weighted spectrum of a number of bins equal to the order of the sideband component whose phase is being estimated and multiplying the weighted spectrum by $A_m e^{j\theta}$ and by $A_m e^{j(\pi-\theta)}$, $A_m$ being a value of the average sideband amplitude distribution, j the imaginary unit, and $\theta$ a variable phase; add together the resulting left-shifted spectrum and right-shifted spectrum.

8. The method of claim 7, further comprising a step of finding the phase of the mask that minimizes the energy in the data record when subtracted from an original data record.

9. The method of claim 1, wherein the jitter phases are estimated as equal to the phase of the sampled signal.

10. The method of claim 1, further using prior knowledge of characteristics of a determined signal component to improve the estimation of the jitter contribution to subtract.

11. The method of claim 1, further including a step of introducing a known calibration signal into the sampled signal.

12. A method as claimed in claim 1, wherein the processor is either a signal processor or signal digitizer.

13. A computer program product embodied on a non-transitory computer readable medium, loadable in a memory of a digital processor, containing executable code arranged to carry out a method the when executed by the digital processor, the method comprising,
   obtaining a frequency-domain data set representing a sampled signal;
   obtaining an average sideband amplitude distribution generated by jitter around one or more principal frequencies of the signal;
   estimating jitter phases for sidebands generated by jitter in the frequency-domain data set;
   subtracting a jitter contribution in the sampled signal characterized by the average sideband amplitude distribution and the estimated jitter phases from a data record.

* * * * *

UNITED STATES PATENT AND TRADEMARK OFFICE
CERTIFICATE OF CORRECTION

PATENT NO.        : 8,355,429 B2
APPLICATION NO.   : 12/648066
DATED             : January 15, 2013
INVENTOR(S)       : Neil Adams It is certified that error appears in the above-identified patent and that said Letters Patent is hereby corrected as shown below:

In column 8, line 13, in claim 7, after "a" delete "its".

In column 8, line 37, in claim 13, after "method" delete "the".

Signed and Sealed this
Ninth Day of April, 2013

Teresa Stanek Rea
*Acting Director of the United States Patent and Trademark Office*